(12) United States Patent
Shinada et al.

(10) Patent No.: US 7,115,471 B2
(45) Date of Patent: Oct. 3, 2006

(54) METHOD OF MANUFACTURING SEMICONDUCTOR DEVICE INCLUDING NONVOLATILE MEMORY

(75) Inventors: Kazuyoshi Shinada, Kanagawa-ken (JP); Akira Kimitsuka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 172 days.

(21) Appl. No.: 10/961,084

(22) Filed: Oct. 12, 2004

(65) Prior Publication Data

US 2005/0136597 A1    Jun. 23, 2005

(30) Foreign Application Priority Data

Dec. 22, 2003   (JP)   ............................ P2003-424226

(51) Int. Cl.
*H01L 21/336*   (2006.01)
(52) U.S. Cl. .................. 438/257; 438/263; 438/264; 438/276; 257/E21.69
(58) Field of Classification Search ................ 438/257, 438/263, 264, 276; 257/E21.69
See application file for complete search history.

(56) References Cited

U.S. PATENT DOCUMENTS

| | | | |
|---|---|---|---|
| 6,027,972 A | 2/2000 | Kerber | |
| 6,211,017 B1 | 4/2001 | Ono | |
| 6,306,690 B1 * | 10/2001 | Kaya et al. ................. | 438/136 |
| 6,432,762 B1 * | 8/2002 | Dalla Libera et al. ...... | 438/217 |
| 6,586,301 B1 | 7/2003 | Orita | |
| 2003/0022447 A1 * | 1/2003 | Park et al. .................. | 438/257 |

FOREIGN PATENT DOCUMENTS

| | | |
|---|---|---|
| JP | 3-20089 | 1/1991 |
| JP | 03-30078 | 3/1991 |
| JP | 11-330425 | 11/1999 |

* cited by examiner

*Primary Examiner*—Fernando L. Toledo
(74) *Attorney, Agent, or Firm*—Oblon, Spivak, McClelland, Maier & Neustadt, P.C.

(57) ABSTRACT

There is provided a method of manufacturing a semiconductor device including a nonvolatile memory including forming an element isolation area surrounding an element area in a semiconductor substrate doped with a first type conductive impurity, forming a gate insulating film on the element area, forming selectively a cap film on the gate insulating film, burying selectively with a mask film surrounding the cap film on the gate insulating film, forming a tunnel window by removing selectively the cap film, forming an impurity diffusion layer in a surface region of the semiconductor substrate underneath the gate insulating film by introducing a second type conductive impurity using the mask film as a mask, removing the gate insulating film in the tunnel window, forming a tunnel insulating film in the tunnel window, forming a floating gate electrode film, an inter-gate electrode film, and a control gate electrode film on the tunnel insulating film, and forming a source-drain in the semiconductor substrate to interpose a surface region of the semiconductor substrate beneath the control gate electrode film by introducing the second type conductive impurity into the surface region using the control gate electrode film as a mask.

16 Claims, 10 Drawing Sheets

METHOD OF MANUFACTURING SEMICONDUCTOR DEVICE INCLUDING NONVOLATILE MEMORY

CROSS REFERENCE TO RELATED APPLICATION

This application is based upon and claims the benefit of priority from the prior Japanese Patent Application (No. 2003-424226, filed on Dec. 22, 2003), the entire contents of which are incorporated herein by reference.

FIELD OF THE INVENTION

The present invention relates to a method of manufacturing a semiconductor device including a nonvolatile memory.

DESCRIPTION OF THE BACKGROUND

A NAND-type flash memory and a NOR-type flash memory have been widely used as a nonvolatile memory. As application of the nonvolatile memory has been expanded to an integrated circuit card in recent years, byte-type nonvolatile memory having capability of rewriting per byte has been much more important. For example, a nonvolatile memory cell which has two transistors, a memory cell transistor and a selection transistor, attracts attention.

In the case of the nonvolatile memory cell, a tunnel window surrounded by an insulating film is opened at the predetermined portion on a semiconductor substrate. A tunnel insulating film is formed in the tunnel window. An electron goes back and forth through the tunnel insulating film between a floating-gate electrode formed on the tunnel insulating film and an impurity diffusion layer in the semiconductor substrate. Rewriting of the data in the nonvolatile memory cell is performed by such an electron behavior.

From the viewpoint of miniaturization of the nonvolatile memory cell and control of effective voltage applied to the floating-gate electrode of the nonvolatile memory cell, a smaller size is required for area of the tunnel window.

In conventional technologies, lithography and dry etching etc. are used for forming smaller opening in a film, such as a resist film, formed on the semiconductor substrate. Moreover, after preparing an opening in a film, another film is formed on the side wall of the opening to narrow width of the opening.

However, the opening process for forming tunnel window has a limitation of lithography and dry etching etc. On the other hand, the side wall process for forming tunnel window has problems such as control of film thickness and uniformity in the cell characteristics of nonvolatile memory.

SUMMARY OF THE INVENTION

According to an aspect of the present invention, there is provided a method of manufacturing a semiconductor device including a nonvolatile memory including forming an element isolation area surrounding an element area in a semiconductor substrate doped with a first conductive impurity, forming a gate insulating film on the element area, forming selectively a cap film on the gate insulating film, burying selectively with a mask film surrounding the cap film on the gate insulating film, forming a tunnel window by removing selectively the cap film, forming an impurity diffusion layer in a surface region of the semiconductor substrate underneath the gate insulating film by introducing a second type conductive impurity using the mask film as a mask, removing the gate insulating film in the tunnel window, forming a tunnel insulating film in the tunnel window, forming a floating gate electrode film, an inter-gate electrode film, and a control gate electrode film on the tunnel insulating film, and forming a source-drain in the semiconductor substrate to interpose a surface region of the semiconductor substrate beneath the control gate electrode film by introducing the second type conductive impurity into the surface region using the control gate electrode film as a mask.

DETAILED DESCRIPTION OF THE INVENTION

Embodiments of the present invention will be described below in detail with reference to the drawing mentioned above.

Figure 1:
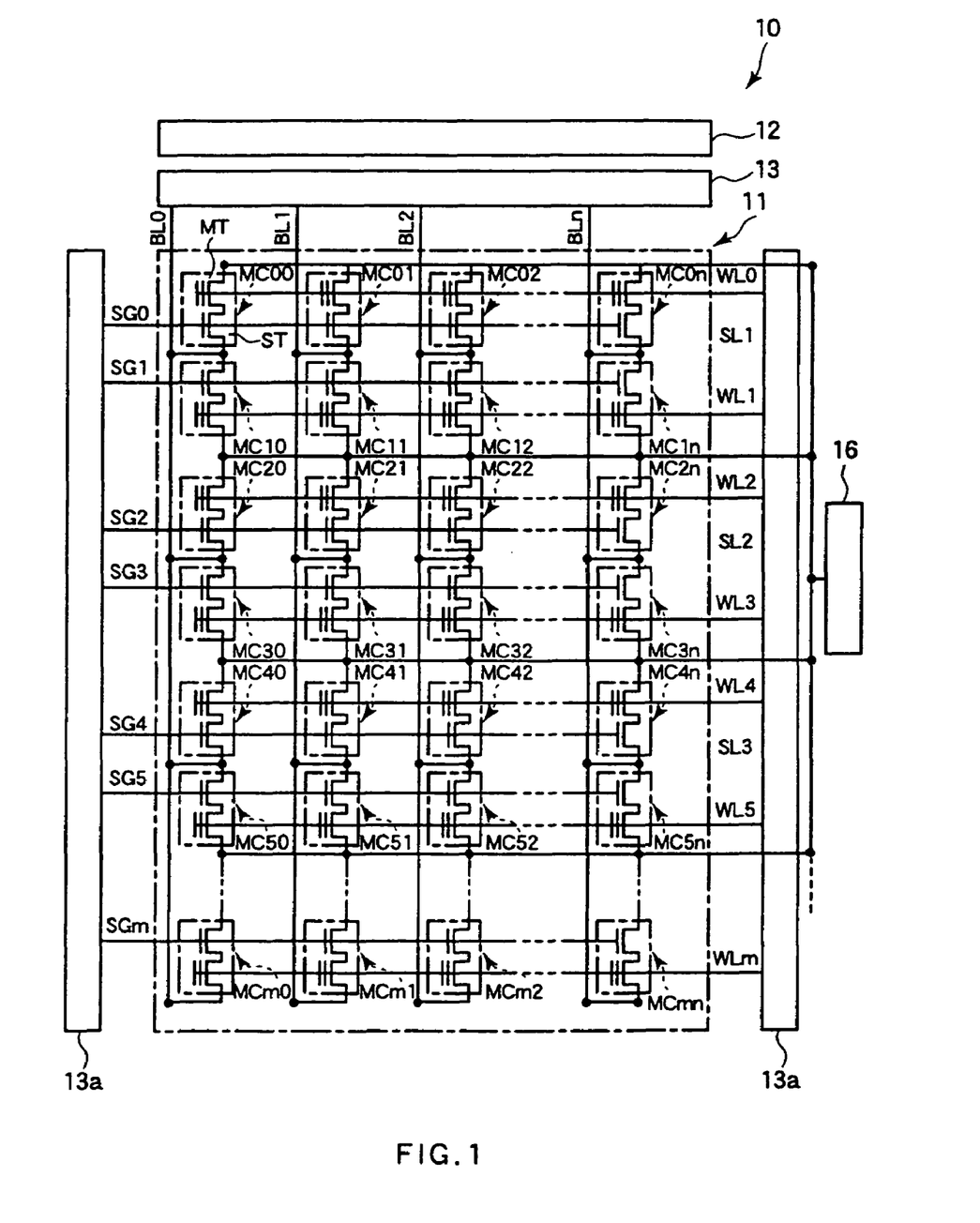
FIG. 1 is a circuit block diagram showing a nonvolatile memory in a first embodiment of the present invention.

FIG. 1 shows a block diagram of the nonvolatile memory in the first embodiment of the present invention. A nonvolatile memory 10 has a memory cell array 11, a column decoder 12, a sense amplifier 13, low decoders 13a, 13b, and a source line driver 16. The memory cell array 11 includes a plurality of memory cells MC.

Each of memory cells MC has a memory cell transistor MT and a select transistor ST. The electrical current path between the memory cell transistor MT and the select transistors ST is connected with each other in series. Each of the source region of the memory cell transistor MT connects to each of the drain region of the select transistors ST.

Moreover, each pair of memory cells MC adjoining mutually in the column direction share the source region of the select transistors ST or the drain region of the memory cell transistor MT of the pair.

A control gate of memory cell transistor MT in the row direction is connected in common with a word line WL. The gate of the select transistor ST in the row direction is connected in common with a select gate line SG. The drain region of memory cell transistor MT is arranged in the column direction and is connected in common with a bit line BL. The source region of the select transistor ST is connected in common with a source line SL. The source line SL is connected to the source line driver 16.

Figure 2:
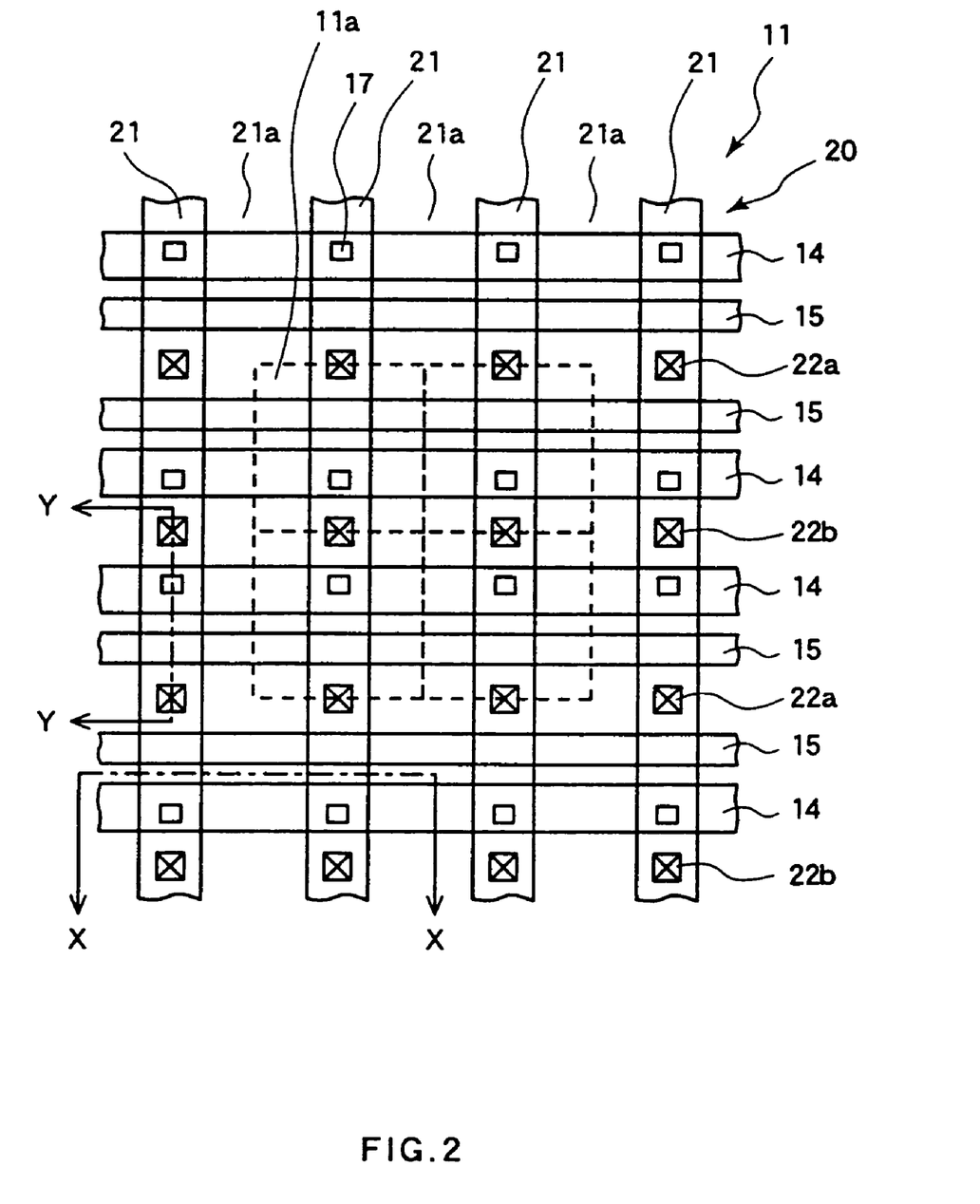
FIG. 2 is a schematic plane view showing the nonvolatile memory in the first embodiment of the present invention.

FIG. 2 shows a schematic plane view of a memory cell array 11. An element isolation region 21a is formed in silicon substrate 20. An element region 21 of a rectangle shape surrounded by the element isolation region 21a is formed. A word line 14 and a select gate line 15 are formed in the memory cell array 11. The word line 14 and the select gate line 15 extend perpendicularly and cross over a plurality of the element region 21.

The memory cell transistor MT is formed at the portion where the word line 14 intersects the element region 21. The select transistor ST is formed at the portion where the select gate lines intersect element region 21. A floating gate electrode film (not illustrated) is formed at the portion where the word line 14 intersects the element region 21.

Contact plugs 22a, 22b of the element region 21 sandwich the word line 14 and select gate line 15, and word line 14 and select gate line 15. A bit line (not illustrated) is formed along with the element region 21. The bit line connects between the contact plugs 22a, 22b.

The memory cell transistor MT and the select transistor ST, which are sandwiched by contact plugs 22a, 22b is constructed for a memory cell unit 11a. First, a p-type silicon substrate 30 is prepared as a semiconductor substrate.

Steps of forming an element isolation area are explained blow. FIGS. 3A to 3D are cross sectional views along the line X—X of FIG. 2, showing the above steps in fabrication method of a semiconductor device in the first embodiment of the present invention.

Figure 3A:
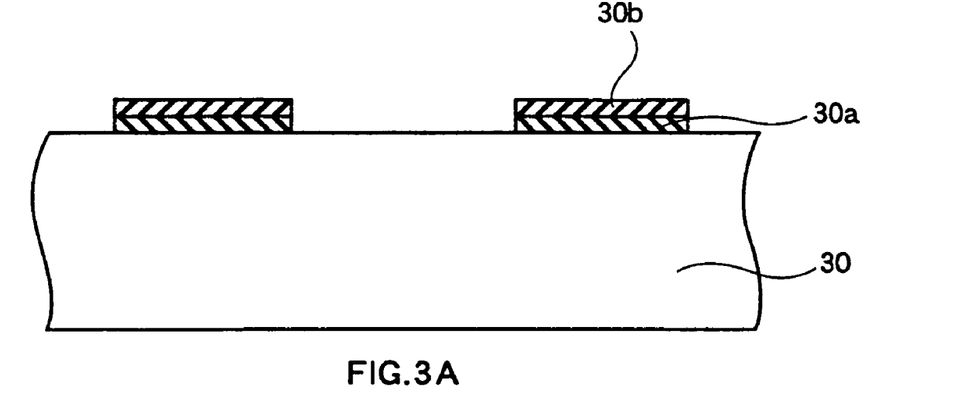
FIGS. 3A to 3L are cross-sectional views showing a method of fabricating a semiconductor device in the first embodiment of the present invention.
Figure 3B:
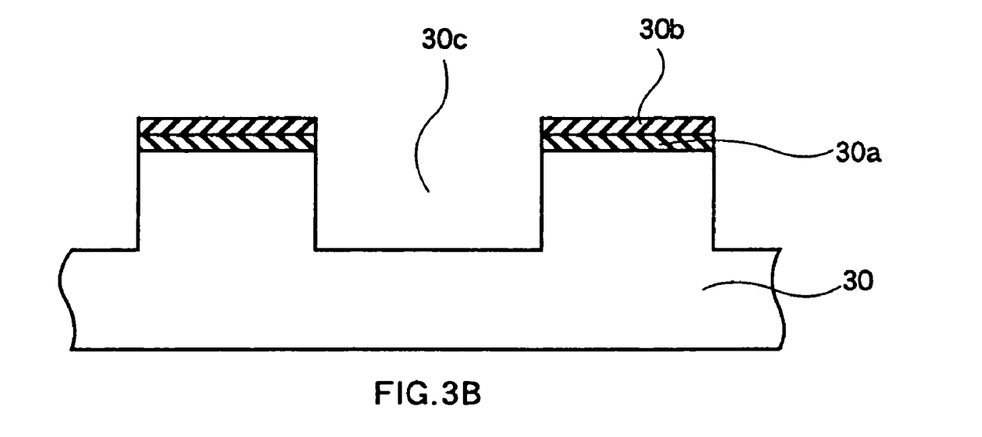

A layered film of a silicon oxide film and a silicon nitride film are formed on the silicon substrate 30. The layered film is selectively delineated by using lithography and dry etching as shown in FIG. 3A. As a result, a layered pattern is formed on the silicon substrate 30. As shown in FIG. 3B, a groove 30c is formed in the silicon substrate 30 by using dry etching, using the layered pattern as a mask.

Figure 3C:
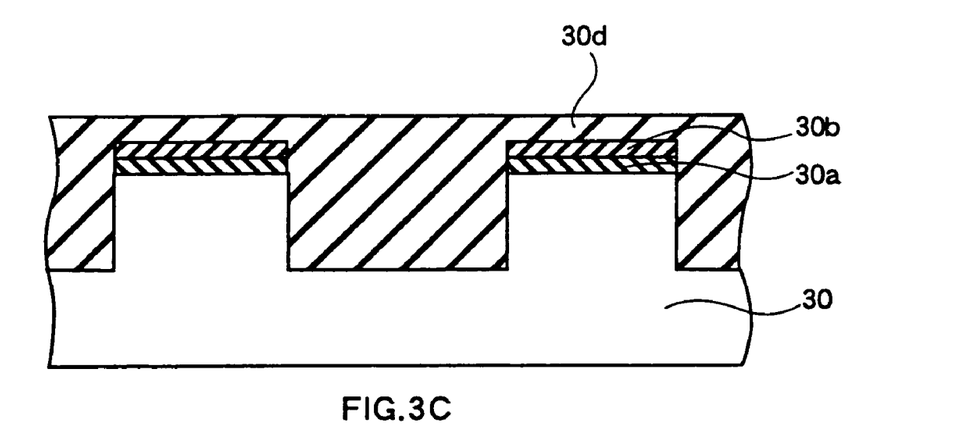
Figure 3D:
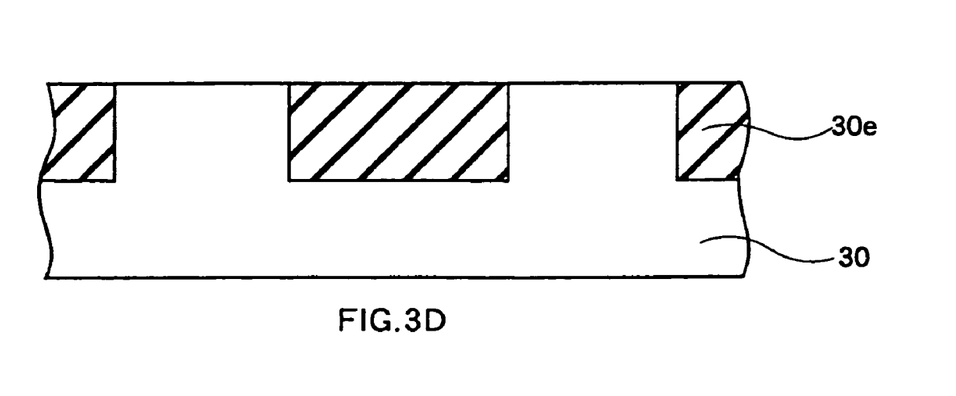

An insulating film 30d is formed on the silicon substrate 30 including the groove 30c by using CVD as shown in FIG. 3C. The insulating film 30d and the layered pattern formed on the silicon substrate 30 are removed flatly by using CMP and etching, and the insulating 30d formed in the groove 30c finally remains as shown in FIG. 3D.

In the first embodiment, a well area is conventionally not formed in the nonvolatile memory region. In a particular case, a p-type well area is formed by using ion implantation technique. A double well structure buried with a p-type well in an n-type well formed in first may also be utilized.

Figure 3E:
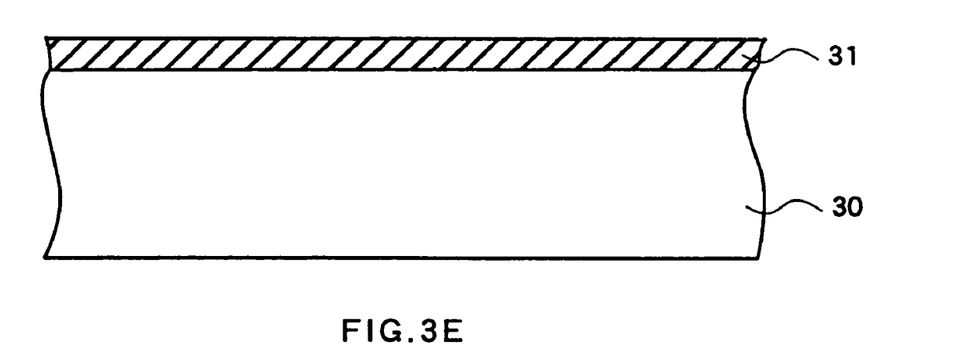

Steps of forming a gate structure of the nonvolatile memory are explained blow. Figures below FIG. 3E are cross sectional views along the line Y—Y of FIG. 2. As shown in FIG. 3E, silicon oxide film having thickness ranged from 30 to 40 nm is thermally grown on the silicon substrate 30 for a gate insulating film 31. A channel region may be formed by using ion implantation as desired.

Figure 3F:
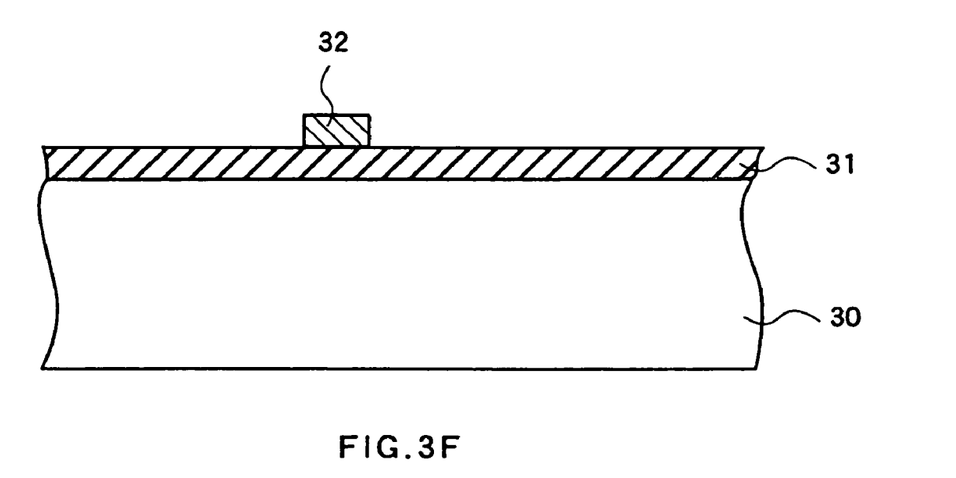

A polycrystalline silicon film having a thickness of such as 50 nm is deposited by using CVD. Subsequently, the polycrystalline silicon film is selectively delineated by using lithography and dry etching. As a result, as shown in FIG. 3F, a patterned cap film 32 is formed on the gate insulating film 31.

Figure 3G:
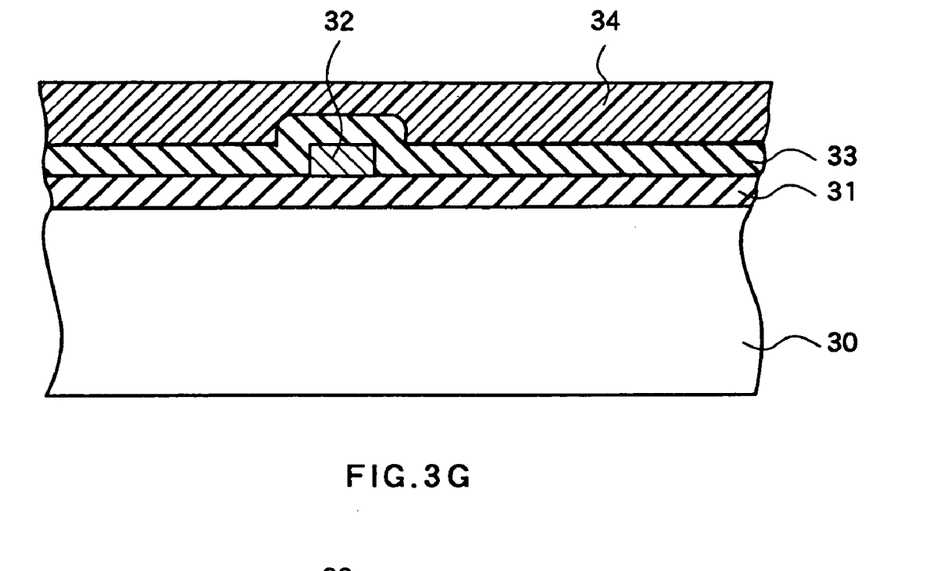
Figure 3H:
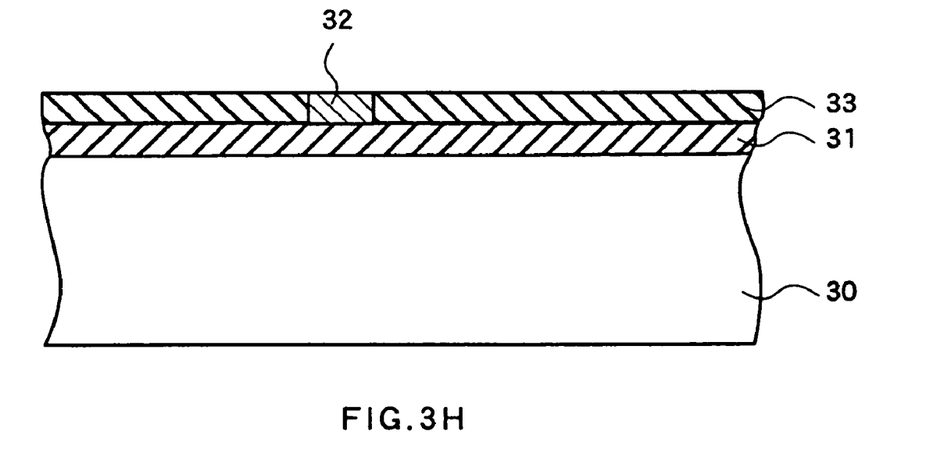

As shown in FIG. 3G, a silicon nitride film having a thickness of such as 50 nm is formed for a mask film 33 by using CVD. A resist film 34 is coated to flatten the surface of the silicon substrate 30. As shown in FIG. 3H, the resist film 34 and the mask film 33 are removed by using dry etching until the surface of the cap film 32 is exposed.

Figure 3I:
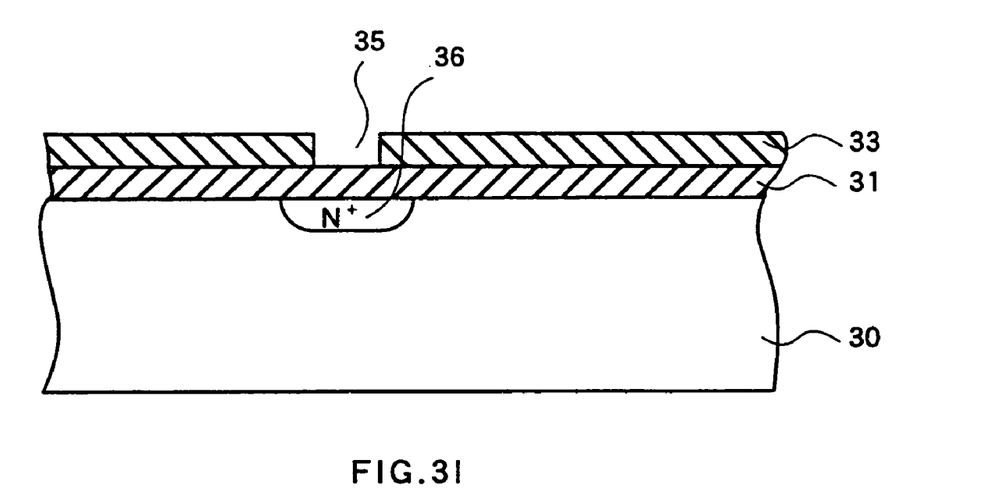

The cap film 32 is selectively removed by using dry etching or wet etching having a highly selective etching ratio to the mask film 33. As a result, a tunnel window 35 is formed as shown in FIG. 3I.

Conductive impurities are introduced into the silicon substrate 30 through the tunnel window 35 using the mask film 33 as a mask. For example, arsenic such as an n-type impurity is implanted with a dose of 1E14 cm$^{-2}$ to 1E15 cm$^{-2}$. Subsequent thermal annealing activates the implanted impurities, arsenic, in the silicon substrate 30 to form an n-type diffusion layer 36.

Figure 3J:
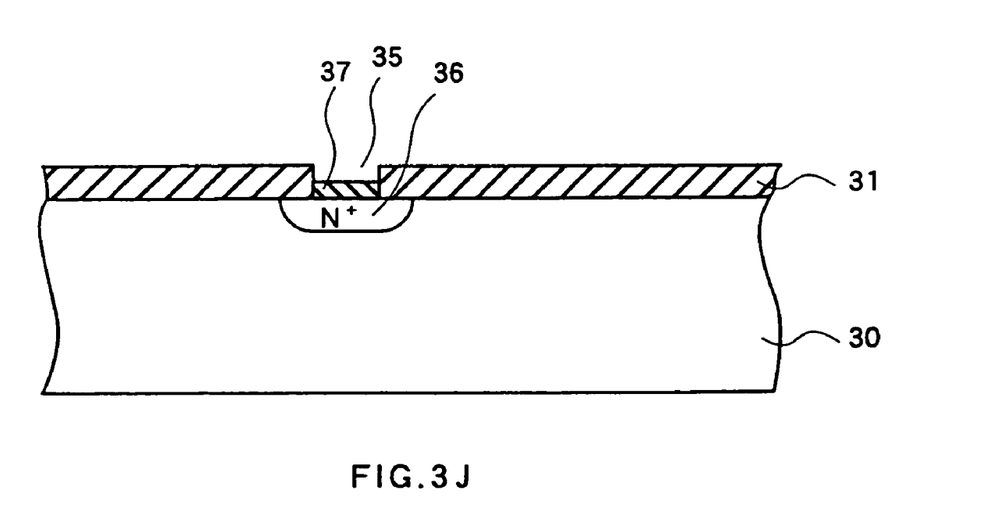

As shown in FIG. 3J, the gate insulating film 31 in the tunnel window 35 is selectively removed by using dry etching or wet etching, using the mask film 33 as a mask. The mask film 33 is selectively removed by using dry etching or wet etching having a highly selective etching ratio to the silicon substrate 30.

Figure 3K:
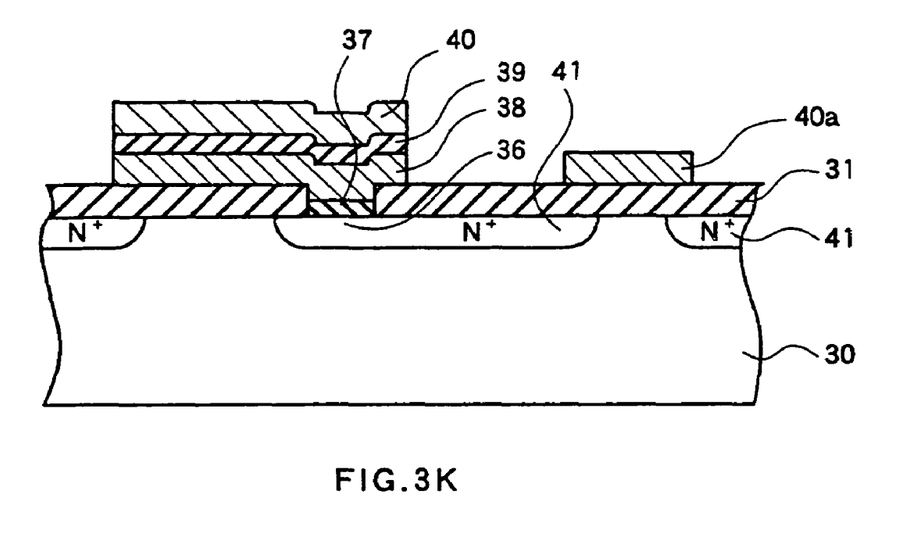

As shown in FIG. 3K, a tunnel gate insulating film 37 having a thickness of such as 9 nm is formed on the n-type diffusion layer 36 in the tunnel window 35 by using thermal oxidation. A layered film of a polycrystalline silicon film having such as 50 nm and a insulating film having such as 20 nm are formed on the silicon substrate 30. The layered film is selectively delineated by using lithography and dry etching. Moreover, a polycrystalline silicon film is formed on the layered film. The upper polycrystalline silicon film is delineated by using lithography and dry etching.

As shown in FIG. 3K, the upper polycrystalline silicon film, the insulating film and the lower polycrystalline silicon film, are utilized for a control gate electrode 40 and a gate electrode 40a, inter-gate insulating film 39, and a floating gate electrode 38, respectively. The control gate electrode 40 and the gate electrode 40a may be doped with a conductive impurity by using ion-implantation technique, respectively, after these films are formed. Furthermore, forming the lower polycrystalline silicon film may be utilized for a gate electrode.

Correspondence relation between the memory transistor MT and the selective transistor ST in FIG. 2 is mentioned below. A layered gate structure having the control gate electrode 40, the inter-gate insulator 39, and the floating gate electrode 38, is the memory transistor MT, and a single gate structure having the gate electrode 40a is the selective transistor ST.

Figure 3L:
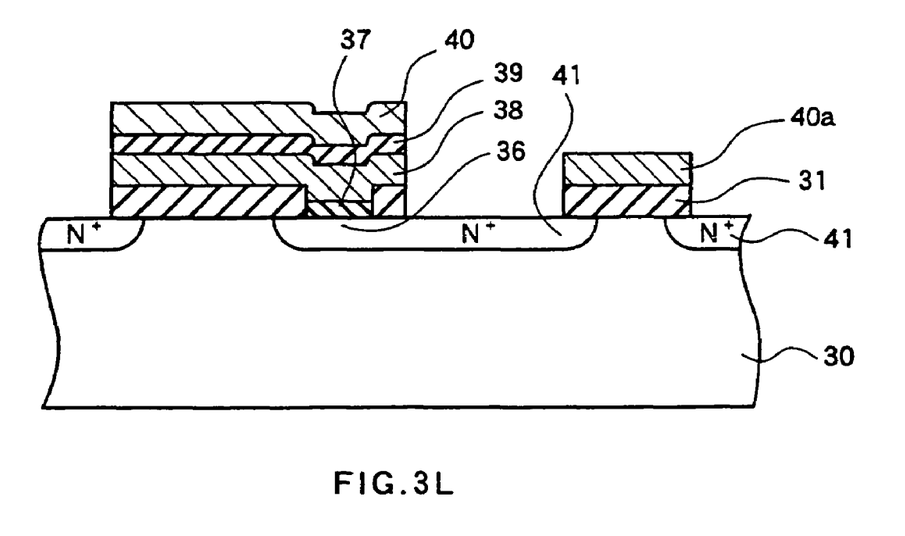

Conductive impurities are introduced into the silicon substrate 30, the control gate electrode 40 and the gate electrode 40a by using ion implantation. For example, arsenic such as an n-type impurity is implanted with a dose of 1E15 cm$^{-2}$ to 1E16 cm$^{-2}$. Subsequent thermal annealing activates the implanted impurities, arsenic, in the silicon substrate 30 to form a source-drain region 41. Finally, the gate insulating film 31 is selectively removed as shown in FIG. 3L. Removing the gate insulating film 31 may skip to progress following steps.

A silicon oxide film (not illustrated) is formed on the silicon substrate 30 by using plasma-assisted CVD. Contact holes are opened in the silicon oxide film. A metal interconnection including bit lines is formed. Furthermore, the formation of the silicon oxide film, the contact holes, and the metal interconnection are carried out, as required. A multilevel interconnection can be formed. The surface of the silicon substrate 30 is covered with a protective insulating film. Pad portions may be opened to finish a semiconductor device including the nonvolatile memory.

According to the embodiment, a polycrystalline silicon film remains as the cap film where a tunnel window is opened. The tunnel window is opened by removing the cap film. Comparing with a conventional method, the method of the embodiment can easily control a fine size of the cap film and lead to miniaturization of the memory cell.

Figure 4:
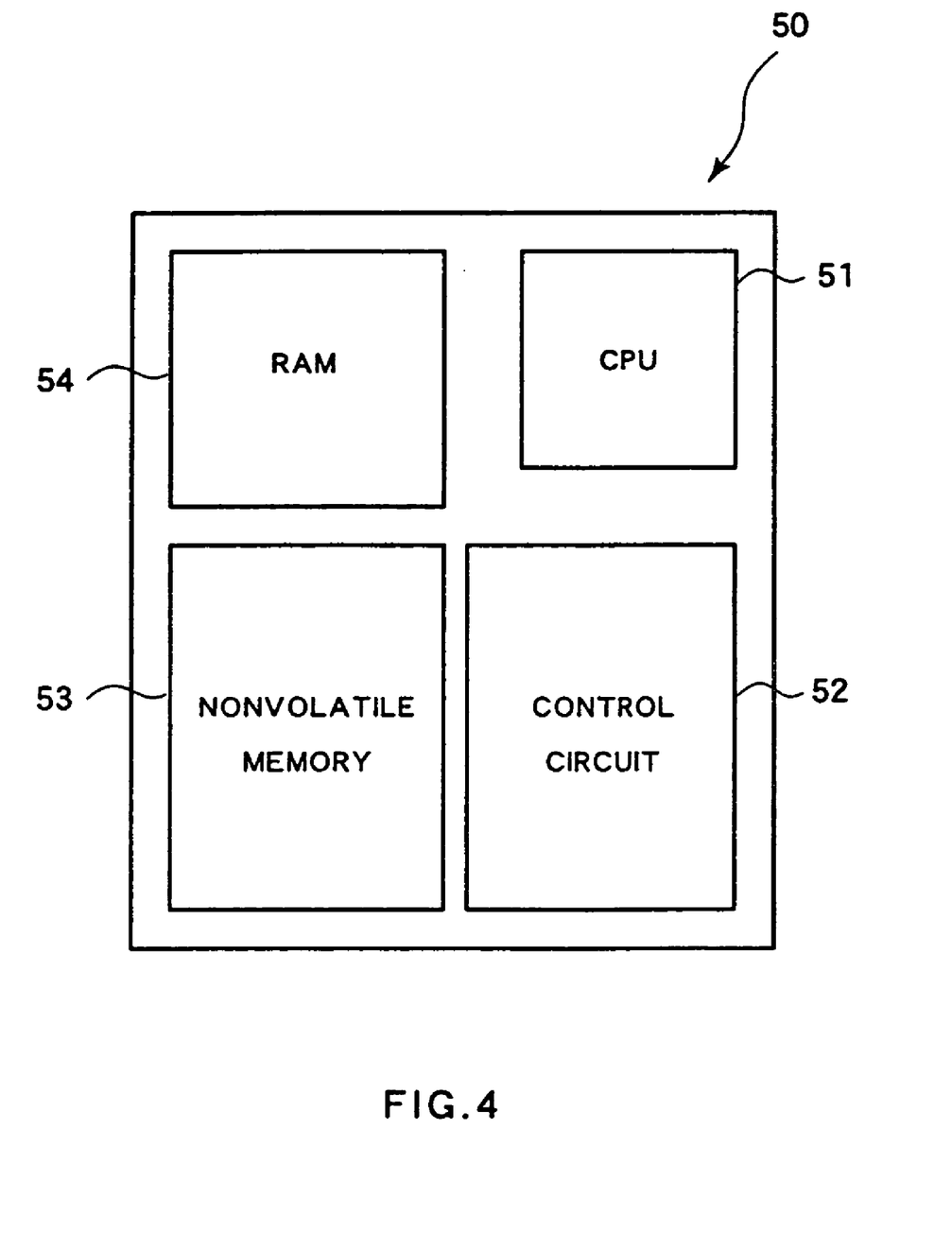
FIG. 4 is a block diagram showing a system LSI in a second embodiment of the present invention.

The second embodiment of the present invention is hereinafter explained. FIG. 4 shows a block diagram of a system LSI in the second embodiment of the present invention. The second embodiment is a system LSI including a nonvolatile memory circuit.

A system LSI 50 has logic circuit area and memory circuit area. For example, A CPU 51 and a control circuit 52 are formed in the logic circuit area. A nonvolatile memory 53 and a RAM 54 are formed in the memory circuit area. The nonvolatile memory 53 is formed for a matrix having memory cells. Each memory cell has a memory cell transistor MT and a selective transistor ST explained in the first embodiment.

Figure 5:
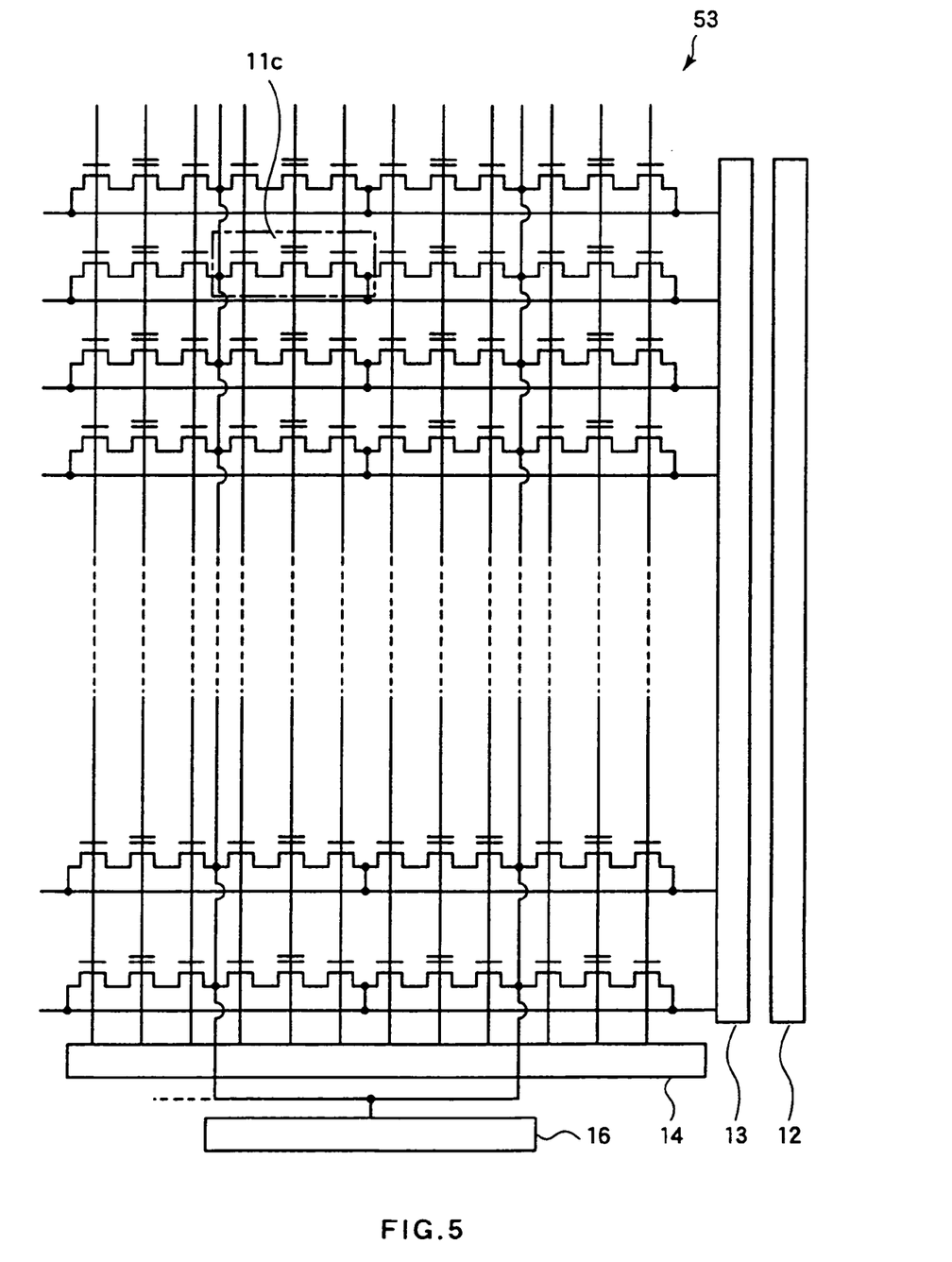
FIG. 5 is a circuit block diagram showing a nonvolatile memory included in the system LSI in the second embodiment of the present invention.

The nonvolatile memory 53 may have a memory cell unit formed of the three transistors. As shown in FIG. 5, a memory cell 11c is formed of one memory cell transistor having a layered gate structure and two select transistors sandwiched the memory cell transistor. A column decoder 12, a sense amplifier 13, a low decoder 14 and a source line driver 16 are formed in the periphery area.

The system LSI 50 having such structures can be applied to a memory card, for example. A fabrication method of the system LSI 50 is fundamentally the same as that of the semiconductor device described with the first embodiment, and consequently, the system LSI 50 can be fabricated easily for a semiconductor device.

The nonvolatile memory 53 having a memory cell unit formed of the two transistors or a memory cell unit formed of the three transistors can be fabricated by the same processes and the same conditions, which leads to simplify the fabrication steps of the system LSI 50. Moreover, it is also possible to apply the above-mentioned fabrication method to a semiconductor device, which contains single nonvolatile memory.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, the cap film may be not only a polycrystalline silicon but also an amorphous silicon, a resist film and an insulating film.

Furthermore, the tunnel gate insulating film, the inter-gate insulating film and the gate insulating film may be not only the silicon oxide film and the silicon nitride film but also silicon oxy-nitride film which contains both oxygen and nitrogen by various composition or metal oxide film such as a hafnium oxide film, a zirconium oxide film, a titanium oxide film, an aluminum oxide film, the compound film of those oxide films and a layered film of those oxide films.

Moreover, the control gate electrode, the floating gate electrode and the gate electrode may be not only a polycrystalline silicon but also an amorphous silicon. On the other hand, a material of the control gate electrode and the gate electrode may be not only a silicon film but also a silicide film such as Co-silicide, Ti-silicide, Ni-silicide, W-silicide, Ta-silicide, and Mo-silicide, etc.

Metal interconnection can be chosen from Al, Cu, Au, Ag, and W, etc. Moreover, underlying barrier metal beneath the metal interconnection may lead to an advantage, such as adhesion with an insulating layer and reaction suppression in a contact area. In this case, a metal such as Co, Ti, W, Ta, Ni, Mo, etc., a metal silicide such as Co-silicide, Ti-silicide, Ni-silicide, W-silicide, Ta-silicide, and Mo-silicide, etc. and a metal nitride such as W-nitride, Mo-nitride, Ti-nitride, etc. may be formed for layered structure.

In addition to a silicon substrate, compound semiconductor substrates such as a SOI substrate and GaAs substrate etc. can be used as a semiconductor substrate. The layered structure can be applied not to the nonvolatile memory but to other kinds of semiconductor devices. Moreover, the nonvolatile memory can be applied to both solo nonvolatile memory and a semiconductor device mixed with various logic circuits.

What is claimed is:

1. A method of fabricating a semiconductor device including a nonvolatile memory, comprising:
    forming an element isolation area surrounding an element area in a semiconductor substrate doped with a first type conductive impurity;
    forming a gate insulating film on the element area;
    forming selectively a cap film on the gate insulating film;
    burying selectively with a mask film surrounding the cap film on the gate insulating film;
    forming a tunnel window by removing selectively the cap film;
    forming an impurity diffusion layer in a surface region of the semiconductor substrate underneath the gate insulating film by introducing a second type conductive impurity using the mask film as a mask;
    removing the gate insulating film in the tunnel window;
    forming a tunnel insulating film in the tunnel window;
    forming a floating gate electrode film, an inter-gate electrode film, and a control gate electrode film on the tunnel insulating film; and
    forming a source-drain in the semiconductor substrate to interpose a surface region of the semiconductor substrate beneath the control gate electrode film by introducing the second type conductive impurity into the surface region using the control gate electrode film as a mask.

2. The method of fabricating the semiconductor device including a nonvolatile memory according to claim 1, wherein the cap film is a polycrystalline silicon or an amorphous silicon.

3. The method of fabricating the semiconductor device including a nonvolatile memory according to claim 1, wherein the mask film is a silicon nitride film.

4. The method of fabricating the semiconductor device including a nonvolatile memory according to claim 2, wherein the mask film is a silicon nitride film.

5. The method of fabricating the semiconductor device including a nonvolatile memory according to claim 1, wherein the first type conductive impurity is a p-type conductive impurity and the second type conductive impurity is an n-type conductive impurity.

6. The method of fabricating the semiconductor device including a nonvolatile memory according to claim 2, wherein the first type conductive impurity is a p-type conductive impurity and the second type conductive impurity is an n-type conductive impurity.

7. The method of fabricating the semiconductor device including a nonvolatile memory according to claim 3, wherein the first type conductive impurity is a p-type conductive impurity and the second type conductive impurity is an n-type conductive impurity.

8. The method of fabricating the semiconductor device including a nonvolatile memory according to claim 1, wherein a memory cell of the nonvolatile memory has a memory cell transistor and a selective transistor, and a step of forming a gate electrode in the selective transistor is identical with the step of forming the control gate electrode in the memory cell transistor.

9. The method of fabricating the semiconductor device including a nonvolatile memory according to claim 2, wherein a memory cell of the nonvolatile memory has a memory cell transistor and a selective transistor, and a step of forming a gate electrode in the selective transistor is identical with the step of forming the control gate electrode in the memory cell transistor.

10. The method of fabricating the semiconductor device including a nonvolatile memory according to claim 3, wherein a memory cell of the nonvolatile memory has a memory cell transistor and a selective transistor, and a step of forming a gate electrode in the selective transistor is identical with the step of forming the control gate electrode in the memory cell transistor.

11. The method of fabricating the semiconductor device including a nonvolatile memory according to claim 5, wherein a memory cell of the nonvolatile memory has a memory cell transistor and a selective transistor, and a step of forming a gate electrode in the selective transistor is identical with the step of forming the control gate electrode in the memory cell transistor.

12. The method of fabricating the semiconductor device including a nonvolatile memory according to claim 1, wherein a memory cell of the nonvolatile memory has a and two selective transistors sandwiching the memory cell transistor, and a step of forming a gate electrode in the two selective transistors is identical with the step of forming the control gate electrode in the memory cell transistor.

13. The method of fabricating the semiconductor device including a nonvolatile memory according to claim 2, wherein a memory cell of the nonvolatile memory has a and two selective transistors sandwiching the memory cell transistor, and a step of forming a gate electrode in the two selective transistors is identical with the step of forming the control gate electrode in the memory cell transistor.

14. The method of fabricating the semiconductor device including a nonvolatile memory according to claim 3, wherein a memory cell of the nonvolatile memory has a and two selective transistors sandwiching the memory cell transistor, and a step of forming a gate electrode in the two selective transistors is identical with the step of forming the control gate electrode in the memory cell transistor.

15. The method of fabricating the semiconductor device including a nonvolatile memory according to claim 5, wherein a memory cell of the nonvolatile memory has a and two selective transistors sandwiching the memory cell transistor, and a step of forming a gate electrode in the two selective transistors is identical with the step of forming the control gate electrode in the memory cell transistor.

16. The method of fabricating the semiconductor device including a nonvolatile memory according to claim 8, wherein a memory cell of the nonvolatile memory has a and two selective transistors sandwiching the memory cell transistor, and a step of forming a gate electrode in the two selective transistors is identical with the step of forming the control gate electrode in the memory cell transistor.

* * * * *